(12) United States Patent
Kaida et al.

(10) Patent No.: US 7,446,454 B2
(45) Date of Patent: Nov. 4, 2008

(54) THICKNESS EXTENSIONAL PIEZOELECTRIC RESONATOR

(75) Inventors: Hiroaki Kaida, Moriyama (JP); Hitoshi Sakaguchi, Toyama (JP); Takashi Hase, Yasu (JP); Jiro Inoue, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 11/605,412

(22) Filed: Nov. 29, 2006

(65) Prior Publication Data

US 2007/0069608 A1    Mar. 29, 2007

Related U.S. Application Data

(63) Continuation of application No. PCT/JP2006/303268, filed on Feb. 23, 2006, and a continuation of application No. PCT/JP2005/012558, filed on Jul. 7, 2005.

(30) Foreign Application Priority Data

Mar. 28, 2005    (JP)    .............. 2005-092001

(51) Int. Cl.
    *H01L 41/08*    (2006.01)
(52) U.S. Cl. ...................... 310/320; 310/348
(58) Field of Classification Search .......... 310/320, 310/324
    See application file for complete search history.

(56) References Cited

U.S. PATENT DOCUMENTS

| 6,054,797 A * | 4/2000 | Wajima et al. | ............... 310/320 |
|---|---|---|---|
| 6,123,867 A * | 9/2000 | Takahashi et al. | ..... 252/62.9 PZ |
| 6,466,106 B1 * | 10/2002 | Gamo | ......................... 333/189 |
| 7,129,799 B2 * | 10/2006 | Sasaki | ......................... 331/158 |

FOREIGN PATENT DOCUMENTS

| JP | 54-85689 | 7/1979 |
|---|---|---|
| JP | 57-194614 | 11/1982 |
| JP | 10-290139 | 10/1998 |
| JP | 11-008527 | 1/1999 |
| JP | 11-130526 | 5/1999 |
| JP | 2002-368567 | 12/2002 |

OTHER PUBLICATIONS

International Search Report from corresponding International application dated Jun. 13, 2006.
Written Opinion (and English translation) from corresponding International application dated Jun. 13, 2006.

* cited by examiner

*Primary Examiner*—Mark Budd
(74) *Attorney, Agent, or Firm*—Dickstein Shapiro LLP (57) ABSTRACT

An energy-trapping-type thickness extensional piezoelectric resonator using a thickness extensional vibration mode having first and second resonance electrodes formed on portions of the top surface and the bottom surface of a piezoelectric substrate that is polarized in the thickness direction thereof, respectively, in which a portion where the first and second resonance electrodes oppose each other is formed as an energy-trapping-type vibration section, wherein, in order to suppress frequency changes of the thickness extensional vibration mode due to temperature, which is a main response using resonance characteristics, a suppression response having a frequency-temperature-change tendency for suppressing frequency changes of the main response due to temperature is brought into close proximity with the main response.

17 Claims, 10 Drawing Sheets

FREQUENCY DIFFERENCE AND GRADIENT OF TEMPERATURE
CHARACTERISTICS (TEMPERATURE RANGE: 0 → 70°C, AT 0°C)

FIG. 19

FREQUENCY DIFFERENCE AND GRADIENT OF TEMPERATURE
CHARACTERISTICS (TEMPERATURE RANGE: 0 → 70°C, AT 0°C)

THICKNESS EXTENSIONAL PIEZOELECTRIC RESONATOR

CROSS REFERENCE TO RELATED APPLICATIONS

The present application is a continuation of International Application No. PCT/JP2006/303268, filed Feb. 23, 2006 and International Application No. PCT/JP2005/012558, filed Jul. 7, 2005, which both claim priority to Japanese Patent Application No. JP2005-092001, filed, Mar. 28, 2005, the entire contents of each of these applications being incorporated herein by reference in their entirety.

FIELD OF THE INVENTION

The present invention relates to an energy-trapping-type thickness extensional piezoelectric resonator using a thickness extensional vibration mode, which is configured to suppress changes, due to temperature, in a resonance frequency or an anti-resonance frequency of a response of a thickness extensional vibration mode to be used.

BACKGROUND OF THE INVENTION

Hitherto, piezoelectric resonators have been used for various piezoelectric resonance parts such as piezoelectric oscillators and piezoelectric filters. Furthermore, piezoelectric resonators using various piezoelectric vibration modes according to a used frequency are known.

Figure 22:
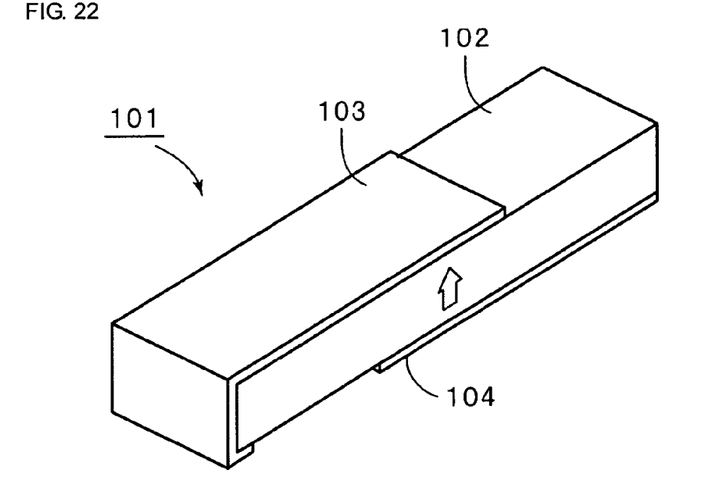
FIG. 22 is a perspective view showing an example of a thickness extensional piezoelectric resonator of the related art.

For example, in Patent Document 1 described below, a thickness extensional piezoelectric resonator 101 shown in FIG. 22 is disclosed. The thickness extensional piezoelectric resonator 101 is an energy-trapping-type piezoelectric resonator that uses a third-order harmonic of a thickness extensional vibration mode. Here, a strip piezoelectric body 102 in the shape of a rectangular plate is used. On the top surface of the piezoelectric body 102, a first resonance electrode 103 is formed, and on the bottom surface, a second resonance electrode 104 is formed. The bottom surface of and the top surface of the resonance electrodes 103 and 104, respectively, oppose each other through the piezoelectric body 102 in the central portion of the piezoelectric body 102 along the length direction thereof. The resonance electrodes 103 and 104 are formed so as to span the full width of the piezoelectric body 102.

When the width of the piezoelectric body 102 is denoted as W, the thickness is denoted as t, and d=t/3, W/d is set to 7.7 or less. As a result, an unwanted spurious frequency that appears when a third-order harmonic of thickness extensional vibration is used can be suppressed.

On the other hand, in Patent Document 2 described below, a similar energy-trapping-type piezoelectric resonator using a third-order harmonic of thickness extensional vibration is disclosed. Here, by setting the ratio W/T of the width W of the piezoelectric body to the thickness T to a specific range, an unwanted spurious frequency between the resonance frequency and the anti-resonance frequency and in the vicinity thereof can be effectively suppressed.

In Patent Document 3 described below, it is disclosed that, in an energy-trapping-type piezoelectric resonator using a third-order harmonic of thickness extensional vibration, for the piezoelectric body, perovskite complex oxide of a specific composition containing Pb, Ti, Li, Sr, and Mn is used, thereby improving the temperature characteristics of the oscillation frequency. That is, in Patent Document 3, it is disclosed that changes in the oscillation frequency at −20° C. to +80° C. due to temperature can be reduced.

Patent Document 1: Japanese Unexamined Patent Application Publication No. 1999-8527
Patent Document 2: Japanese Unexamined Patent Application Publication No. 1998-290139
Patent Document 3: Japanese Unexamined Patent Application Publication No. 1999-130526

In recent years, in a piezoelectric oscillator, there has been an increasing demand for a reduction of changes in an oscillation frequency due to temperature. For example, in the range of temperature of 0 to 70° C., there has been a demand for changes in the oscillation frequency to be in the range of approximately ±100 ppm at room temperature.

In the piezoelectric oscillator using a third-order harmonic of a thickness extensional vibration mode, which is disclosed in Patent Document 3 described above, changes in the oscillation frequency due to temperature are reduced by using a piezoelectric body of a specific composition. However, with only such a selection of materials, it has been very difficult to make the amount of changes in the oscillation frequency to be within ±100 ppm, for example, in the temperature range of 0 to 70° C. For example, in a piezoelectric oscillator indicated by No. 14 in FIG. 1 in Patent Document 3, the above-described demand is not satisfied.

Furthermore, the frequency-temperature characteristics of the piezoelectric resonator change according to various conditions, such as a polarization voltage when piezoelectric bodies to be used are manufactured or a heat treatment temperature after polarization. Therefore, even if temperature characteristics are to be controlled by adjusting the composition, there is a risk that temperature characteristics become different from designed temperature characteristics depending on various conditions of actual manufacturing steps. That is, it has been very difficult to accurately set temperature characteristics only by adjusting the composition of materials from which a piezoelectric body is formed.

In addition, many experiments and much time have been necessary for developing materials, such as selection of the composition range, and it has not been easy to reliably find temperature characteristics to be required, thereby necessitating much effort and labor.

On the other hand, in piezoelectric resonators of Patent Documents 1 and 2 described above, an unwanted spurious frequency between the resonance frequency and the anti-resonance frequency is suppressed. In order to suppress such a spurious frequency, the dimensions of the piezoelectric resonator described above are set to be within a specific range. However, in Patent Documents 2 and 3, it is described that frequency characteristics are improved by suppressing or shifting the unwanted spurious frequency, but no mention is made of the temperature characteristics themselves of the resonance frequency. That is, in Patent Documents 2 and 3, suppression of spurious frequency is considered by adjusting the dimensions of a piezoelectric body. As a consequence, the piezoelectric resonator has various temperature characteristics depending on dimensions with which such suppression of the spurious frequency is possible. Therefore, it has been difficult to reliably reduce changes in characteristics due to changes with temperature. That is, it has been difficult to make the changes in characteristics ±100 ppm or less in the range of temperature of 0 to 70° C.

SUMMARY OF THE INVENTION

In view of the above-described present circumstances of the related art, an object of the present invention is to provide a thickness extensional piezoelectric resonator with superior frequency-temperature characteristics, in which changes in the frequency characteristics are suppressed over a wide temperature range.

According to the present invention, there is provided an energy-trapping-type thickness extensional piezoelectric resonator using a thickness extensional vibration mode, including: a piezoelectric substrate having a top surface and a bottom surface, the piezoelectric substrate being polarized in a thickness direction connecting the top surface and the bottom surface; and first and second resonance electrodes that are formed on portions of the top surface and the bottom surface of the piezoelectric substrate, respectively, and that are arranged so as to oppose each other with the piezoelectric substrate therebetween, wherein, in order to suppress changes in frequency of a response of the thickness extensional vibration mode due to temperature, the response being a main response for using resonance characteristics, a response for suppression having a frequency-temperature-change tendency for suppressing changes in frequency of the main response due to temperature is coupled with the main response so as to suppress changes in frequency of the main response due to temperature.

In this specification, the term "coupling" refers to a state in which responses for suppression are brought into close proximity with each other and two vibration modes are mixed.

In a specific aspect of the thickness extensional piezoelectric resonator according to the present invention, the response for suppression has a frequency-temperature-change tendency in a direction opposite to that of a frequency-temperature-change tendency of the main response.

In another specific aspect of the thickness extensional piezoelectric resonator according to the present invention, the frequency-temperature-change tendency of the response for suppression is in the same direction as that of the frequency-temperature-change tendency of the main response, and the changes in frequency of the response for suppression are smaller than the changes in frequency of the main response due to temperature.

In another specific aspect of the thickness extensional piezoelectric resonator according to the present invention, the piezoelectric substrate has a strip shape extending in a length direction, the first and second resonance electrodes are formed so as to span the full width of the piezoelectric substrate in the central area in the length direction of the top surface and the bottom surface of the piezoelectric substrate, respectively, and the response for suppression is a response resulting from the width dimension of the piezoelectric substrate.

In another specific aspect of the thickness extensional piezoelectric resonator according to the present invention, at least one resonance frequency of the response resulting from the width dimension is higher than the anti-resonance frequency of the main response.

In another specific aspect of the thickness extensional piezoelectric resonator according to the present invention, when the anti-resonance frequency of the main response is denoted as Fa(TE) and the resonance frequency of the response resulting from the width dimension is denoted as Fr(WH), (Fr(WH)−Fa(TE))/Fa(TE) is greater than 0 and smaller than or equal to 0.04 at least in the upper limit of the used temperature range. Preferably, the above-described range is satisfied over the total range of each used temperature range.

In another specific aspect of the thickness extensional piezoelectric resonator according to the present invention, at least one response resulting from the width dimension is lower than the resonance frequency of the main response.

In another specific aspect of the thickness extensional piezoelectric resonator according to the present invention, when the resonance frequency of the main response is denoted as Fr(TE) and the anti-resonance frequency of the response resulting from the width dimension is denoted as Fa(WL), (Fr(TE)−Fa(WL))/Fr(TE) is greater than 0 and smaller than or equal to 0.04 at least in the lower limit of the used temperature range. Preferably, the above-described range is satisfied over the total range of each used temperature range.

In another specific aspect of the thickness extensional piezoelectric resonator according to the present invention, the response resulting from the width dimension includes a first response at a frequency higher than the anti-resonance frequency of the main response and a second response at a frequency lower than the resonance frequency of the main response.

In another specific aspect of the thickness extensional piezoelectric resonator according to the present invention, when the resonance frequency of the main response is denoted as Fr(TE), the anti-resonance frequency is denoted as Fa(TE), the resonance frequency of the first response is denoted as Fr(WH), and the anti-resonance frequency of the second response is denoted as Fa(WL), (Fr(WH)−Fa(TE))/Fa(TE) is greater than 0 and smaller than or equal to 0.04 at least in the upper limit of the used temperature range, and (Fr(TE)−Fa(WL))/Fr(TE) is greater than 0 and smaller than or equal to 0.04 at least in the lower limit of the used temperature range. Preferably, the above-described range is satisfied over the total range of each used temperature range.

In the thickness extensional piezoelectric resonator according to the present invention, various thickness extensional vibration modes can be used. For example, as a main response, a harmonic response of thickness extensional vibration can be used. In a more limited aspect of the present invention, a thickness extensional piezoelectric resonator using a third-order harmonic of thickness extensional vibration is provided.

In the thickness extensional piezoelectric resonator according to the present invention, an internal electrode of at least one layer provided in the piezoelectric substrate in such a manner as to oppose first and second resonance electrodes with a piezoelectric substrate layer therebetween may further be provided.

In the thickness extensional piezoelectric resonator according to the present invention, first and second resonance electrodes are formed on the top surface and the bottom surface of a piezoelectric substrate, respectively, in such a manner as to oppose each other with the piezoelectric substrate therebetween, the piezoelectric substrate being polarized in the thickness direction. Therefore, resonance characteristics in which an energy-trapping-type thickness extensional vibration mode is used can be obtained by applying an AC electric field from the first and second resonance electrodes. Moreover, in order to suppress changes due to temperature in frequency of a main response for the purpose of using resonance characteristics, a response for suppression having a frequency-temperature-change tendency for suppressing the changes in frequency is coupled with a main response. Therefore, it is possible to provide a thickness extensional piezoelectric resonator with superior temperature characteristics, in which changes in frequency of a main response to be used due to temperature are reduced.

In the present invention, since a response for suppression, having a frequency-temperature-change tendency for suppressing changes with temperature of a resonance frequency and/or an anti-resonance frequency, which appears in the resonance characteristics, is used, the amount of changes in frequency due to changes with temperature can be reduced to be substantially ±100 ppm in the range of temperature of, for example, 0 to 70° C.

In the method described in Patent Document 3 described above, even if a piezoelectric body having a composition in a specific range is used, frequency-temperature characteristics are forced to change due to a polarization voltage and a heat treatment temperature during actual manufacturing time. In comparison, in the present invention, since a response that appears in the resonance characteristics of the thickness extensional piezoelectric resonator is used, frequency-temperature characteristics can be reliably improved.

In addition, in the method for improving frequency-temperature characteristics based on the development of materials as described in Patent Document 3, when a piezoelectric resonator of a frequency to be used is to be obtained, many experiments need to be repeated each time it is to be obtained. In comparison, according to the present invention, it is possible to easily provide a thickness extensional piezoelectric resonator having desired temperature characteristics when compared to the development of materials.

When the response for suppression has a frequency-temperature-change tendency in a direction opposite to that of a frequency-temperature-change tendency of the main response, the frequency-temperature-change tendency of the response for suppression is cancelled by the frequency-temperature-change tendency of the main response, and thus the frequency change of the main response is suppressed.

The frequency-temperature-change tendency of the response for suppression may be in the same direction as the frequency-temperature-change tendency of the main response. If the frequency change of the response for suppression is smaller than the frequency change of the main response due to temperature, the frequency-temperature-change tendency of the response for suppression makes it possible to reduce the frequency change of the main response due to temperature.

In the present invention, the piezoelectric substrate has a strip rectangular shape extending in a length direction, and first and second resonance electrodes are formed so as to span the full width of the piezoelectric substrate in the central portion of the top surface and the bottom surface, respectively, of the piezoelectric substrate along the length direction. When the response for suppression is a response resulting from the dimension of the piezoelectric substrate in the width direction, in the strip-shaped thickness extensional piezoelectric resonator, by controlling the dimension along the width direction, changes in frequency of the main response due to temperature can be suppressed.

When the resonance frequency of at least one response resulting from the width dimension is higher than the anti-resonance frequency of the main response, changes in the anti-resonance frequency of the main response due to temperature can be reduced. In at least the upper limit of the used temperature range, preferably, over the total used temperature range, when (Fr(WH)−Fa(TE))/Fa(TE) is greater than 0 and smaller than or equal to 0.04, changes in the anti-resonance frequency of the main response due to temperature can be reduced more effectively.

The response for suppression resulting from the width dimension may be lower than the resonance frequency of the main response. In this case, changes in the resonance frequency of the main response can be suppressed. At least in the upper limit, preferably, over the total used temperature range, when (Fr(TE)−Fa(WL))/Fr(TE) is greater than 0 and smaller than or equal to 0.04, as is clear from examples of experiments (to be described later), changes in the resonance frequency of the main response due to temperature can be suppressed more effectively.

When, as responses resulting from the width dimension, a first response at a frequency higher than the anti-resonance frequency of the main response and a second response at a frequency lower than the anti-resonance frequency of the main response exist, changes in both the resonance frequency and the anti-resonance frequency of the main response due to temperature can be reduced effectively in accordance with the present invention.

In at least the upper limit and the lower limit of each used temperature range, preferably, over the total used temperature range, when (Fr(WH)−Fa(TE))/Fa(TE) is greater than 0 and smaller than or equal to 0.04 in the manner described above, changes in the resonance frequency and the anti-resonance frequency of the main response can be suppressed more effectively.

When a harmonic of thickness extensional vibration is used as a main response, usage at higher frequencies is possible in accordance with the present invention, and furthermore a thickness extensional piezoelectric resonator having improved temperature characteristics in accordance with the present invention can be provided. In particular, in the case of an energy-trapping-type thickness extensional piezoelectric resonator using a third-order harmonic of thickness extensional vibration, it is possible to provide the thickness extensional piezoelectric resonator having improved temperature characteristics in accordance with the present invention.

When the thickness extensional piezoelectric resonator according to the present invention further includes an internal electrode of at least one layer, it is possible to provide a thickness extensional piezoelectric resonator using harmonics of various thickness extensional vibrations corresponding to the number of stacked layers of the internal electrodes.

REFERENCE NUMERALS

1 . . . thickness extensional piezoelectric resonator
2 . . . piezoelectric substrate
2a . . . top surface
2b . . . bottom surface
2c, 2d . . . end surface
3 . . . first resonance electrode
4 . . . second resonance electrode
5 . . . connection electrode
6 . . . terminal electrode
7 . . . connection electrode
8 . . . terminal electrodes
9, 10 . . . conductive bonding agent
11 . . . mounting substrate
11a, 11b . . . electrode
21 . . . thickness extensional piezoelectric resonator
22 . . . piezoelectric substrate
22a . . . top surface
22b . . . bottom surface
23 . . . resonance electrode
24 . . . resonance electrode
25 . . . internal electrode
26, 27 . . . connection electrode
28 . . . terminal electrode
29 . . . terminal electrode

DETAILED DESCRIPTION OF THE INVENTION

The present invention will be clarified below by illustrating specific embodiments of the present invention.

Figure 1:
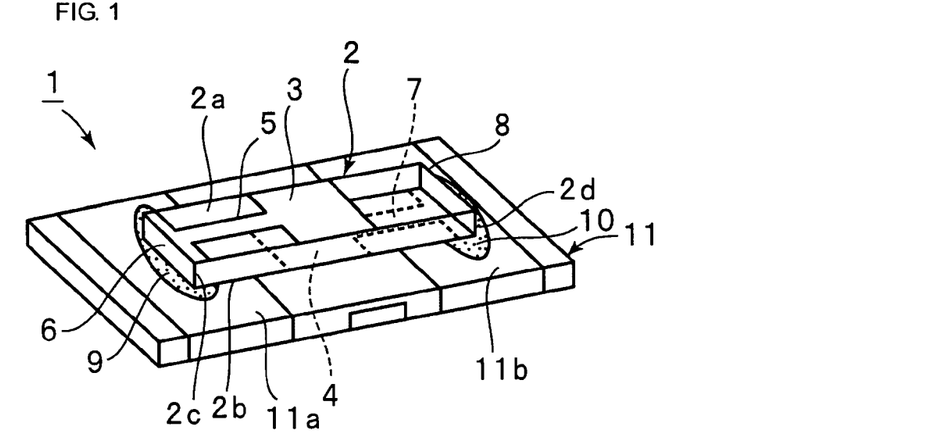
FIG. 1 is a perspective view showing piezoelectric resonance parts, in which a piezoelectric resonator according to an embodiment of the present invention is mounted on a mounting substrate.

FIG. 1 is a perspective view of piezoelectric resonance parts constituting a piezoelectric resonator according to an embodiment of the present invention. A piezoelectric resonator 1 of this embodiment has a strip piezoelectric body 2 having the shape of a narrow rectangular plate with a length of 2.2 mm, a width of 0.54 mm, and a thickness of 0.25 mm. The piezoelectric body 2 is formed of $PbTiO_3$-based piezoelectric ceramic and is polarized in the thickness direction. The piezoelectric body 2 may also be formed of another piezoelectric ceramic.

In the piezoelectric body 2, an electromechanical coupling coefficient $k_{33}$ in the thickness direction is 43.9%, and an electro-mechanical coupling coefficient $k_{31}$ in the width direction is 7.7%. During the above-described polarization, a polarization was performed by applying a voltage of 9 kV/mm at a temperature of 60° C.

A first resonance electrode 3 having a length of 0.65 mm and a width of 0.54 mm is formed on a position at the center of a top surface 2a of the piezoelectric body 2. A second resonance electrode 4 having the same shape as the first resonance electrode 3 is formed in the center of a bottom surface 2b of the piezoelectric substrate 2 in such a manner as to oppose the first resonance electrode 3 with the piezoelectric substrate 2 therebetween. The first and second resonance electrodes 3 and 4 are formed so as to span the full width of the piezoelectric substrate 2.

On the top surface 2a of the piezoelectric substrate 2, the first resonance electrode 3 is electrically connected via a connection electrode 5 to a terminal electrode 6 provided on one of the end surfaces 2c of the piezoelectric substrate 2. The terminal electrode 6 is formed so as to extend to the end surface 2c from the top surface 2a of the piezoelectric substrate 2. Furthermore, the terminal electrode 6 extends to the bottom surface 2b from the end surface 2c.

The width of the connection electrode 5, that is, the dimension in the width direction of the piezoelectric body 2 of the connection electrode, is set to 0.15 mm. The dimension between the end portion on the resonance electrode 3 side on the top surface 2a of the piezoelectric body 2 of the terminal electrode 6, the top surface 2a, and the end surface 2c is set to 0.15 mm.

On the other hand, on the bottom surface 2b of the piezoelectric substrate 2, the second resonance electrode 4 is electrically connected via a connection electrode 7 to a terminal electrode 8 provided on an end surface 2d opposite to the end surface 2c. The terminal electrode 8 extends to the bottom surface 2b from the end surface 2d, and the portion extending to the bottom surface is electrically connected to the connection electrode 7. The two dimensional form of the bottom surface 2d of the piezoelectric body 2 of the connection electrode 7 and the terminal electrode 8 is similar to that of the connection electrode 5 and the terminal electrode 6.

The resonance electrodes 3 and 4, the connection electrodes 5 and 7, and the terminal electrodes 6 and 8 can be made of suitable conductive materials. In this embodiment, a thin film of silver having a thickness of 0.3 µm is formed by sputtering.

As shown in FIG. 1, the thickness extensional piezoelectric resonator 1 is bonded to a mounting substrate 11 by using conductive bonding agents 9 and 10. The mounting substrate 11 is made of a suitable insulating material, such as an insulating ceramic such as alumina. On the mounting substrate 11, electrodes 11a and 11b are formed. The electrodes 11a and 11b are formed in such a manner as to extend from the top surface of the mounting substrate 11, pass over both sides, and reach the bottom surface. The terminal electrodes 6 and 8 of the piezoelectric resonator 1 are electrically connected to the electrodes 11a and 11b via the conductive bonding agents 9 and 10, respectively, and are mechanically coupled.

In order not to obstruct the vibration of the vibration sections of the energy-trapping-type thickness extensional piezoelectric resonator 1, a space is provided below the portion of vibration sections, that is, the place where the resonance electrodes 3 and 4 oppose each other. That is, the piezoelectric resonator 1 is mounted on the mounting substrate 11 using the conductive bonding agents 9 and 10 having a thickness so that a space is formed between the bottom surface of the resonance electrode 4 and the mounting substrate 11.

In the thickness extensional piezoelectric resonator 1, when an AC electric field is applied from the terminal electrodes 6 and 8, the energy-trapping-type piezoelectric vibration sections such that the resonance electrodes 3 and 4 oppose each other vibrate in the thickness direction, and the resonance characteristics provided by a third-order harmonic of thickness extensional vibration can be used.

The piezoelectric body 2 vibrates in the width direction and in the length direction as well as in the thickness direction. Since the resonance electrodes 3 and 4 are formed over the full width of the piezoelectric body 2, vibrations in the width direction have resonance frequencies of a plurality of width modes, which vary according to the width dimension of the piezoelectric body 2. In the present application, for example, resonance in the width direction as in the width mode is referred to as a "response resulting from the width dimension".

In general, in a thickness extensional piezoelectric resonator configured by using piezoelectric ceramics, for the resonance characteristics, as temperature increases, the resonance frequency and the anti-resonance frequency shift toward higher frequencies. That is, the thickness extensional piezoelectric resonator 1 often has a positive frequency-temperature-change tendency. More specifically, as shown in FIG. 2, at room temperature (25° C.), in the thickness extensional piezoelectric resonator having resonance characteristics indicated by the solid line, when temperature becomes higher than 25° C., the resonance frequency and the anti-resonance frequency often shift toward higher frequencies as indicated by a broken line.

In the thickness extensional piezoelectric resonator 1 of this embodiment, the response resulting from the width dimension is positioned in the vicinity of the anti-resonance frequency of the main response at frequencies higher than the anti-resonance frequency of the main response so that such variations of the resonance frequency and the anti-resonance frequency due to changes with temperature become small.

Figure 3:
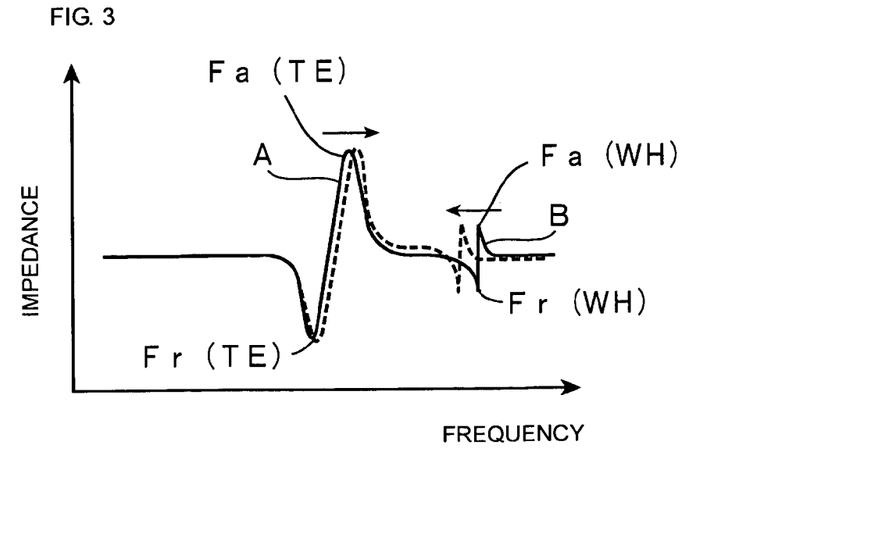
FIG. 3 is a schematic view showing changes in frequency of a main response during temperature increase and changes in frequency of a first response for suppression at higher frequencies due to temperature increase in the thickness extensional piezoelectric resonator according to an embodiment of the present invention.

This will now be described with reference to FIG. 3. As shown in FIG. 3, a response B for suppression based on the width mode is positioned at frequencies higher than that of the main response indicated by the arrow A. The response B for suppression based on the width mode exists at a position indicated by the solid line at room temperature. As temperature becomes higher than room temperature, the response B for suppression shifts toward lower frequencies as indicated by the broken line. That is, the response B for suppression has a negative frequency-temperature-change tendency.

Figure 2:
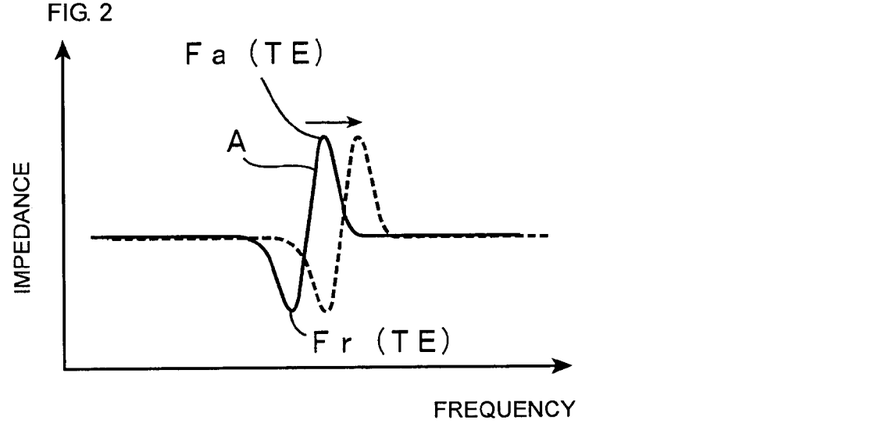
FIG. 2 is a schematic view showing frequency changes of resonance characteristics due to temperature increase of a main response in a thickness extensional piezoelectric resonator.

When temperature increases from room temperature to, for example, approximately 70° C., which is an upper limit of the used temperature range, and when, as shown in FIG. 2, the response for suppression does not exist near the main response, the frequency of the main response shifts toward higher frequencies, as indicated by the broken line of FIG. 2. That is, changes in the resonance frequency and the anti-resonance frequency due to changes with temperature are forced to become large.

In comparison, in this embodiment, as shown in FIG. 3, the response B for suppression is positioned in the vicinity of the anti-resonance frequency at higher frequencies of the anti-resonance frequency of the main response A. Therefore, as temperature increases, the frequency of the response B for suppression decreases as indicated by the broken line, so that the shift toward higher frequencies of the anti-resonance frequency of the main response A is suppressed. That is, the positive frequency-temperature-change tendency of the main response is cancelled by the negative frequency-temperature-change tendency of the response for suppression. As a result, frequency changes in the main response due to changes with temperature are effectively suppressed.

Figure 4:
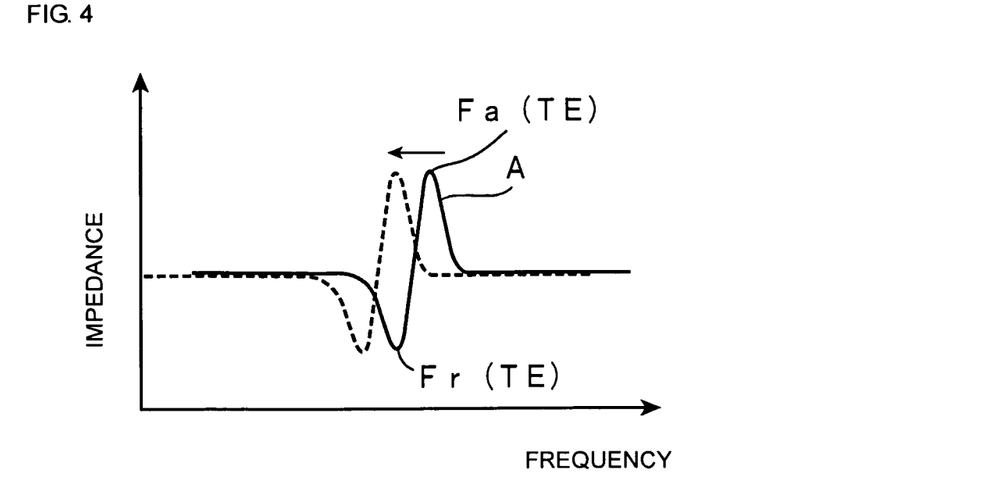
FIG. 4 shows changes in frequency of a main response due to a decrease in temperature when a response for suppression does not exist near the main response.

On the other hand, when the temperature changes to a temperature lower than room temperature, as shown in FIG. 4, the response A for suppression shifts toward lower frequencies, as indicated by the broken line.

Figure 5:
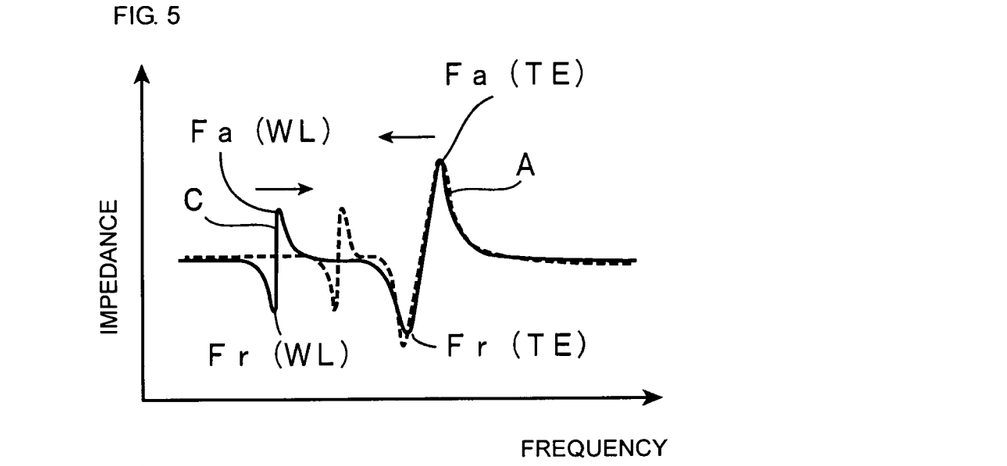
FIG. 5 shows changes in frequency of a main response and changes in frequency of a second response for suppression when temperature is decreased.

In comparison, in this embodiment, as shown in FIG. 5, a second response C for suppression based on the width mode is positioned at lower frequencies of the main response A. The second response C for suppression exists at a position indicated by the solid line at room temperature, and as temperature decreases, the second response C for suppression shifts so that the frequency becomes higher, as indicated by the broken line. That is, when the temperature changes lower than room temperature, the frequency of the main response becomes lower, whereas the frequency of the second response C for suppression becomes higher. As a result, the shift of the resonance frequency of the main response A toward lower frequencies due to temperature decrease is suppressed.

Therefore, in this embodiment, the first and second responses B and C for suppression are brought into close proximity with each other in the vicinity of high frequencies and low frequencies of the anti-resonance frequency Fa and the resonance frequency Fr of the main response in order to have the suppression effect and are coupled together. As a consequence, frequency changes in the resonance characteristics due to changes with temperature from room temperature to a high temperature or to a low temperature can be effectively reduced. This is schematically shown in FIG. 6.

Figure 6:
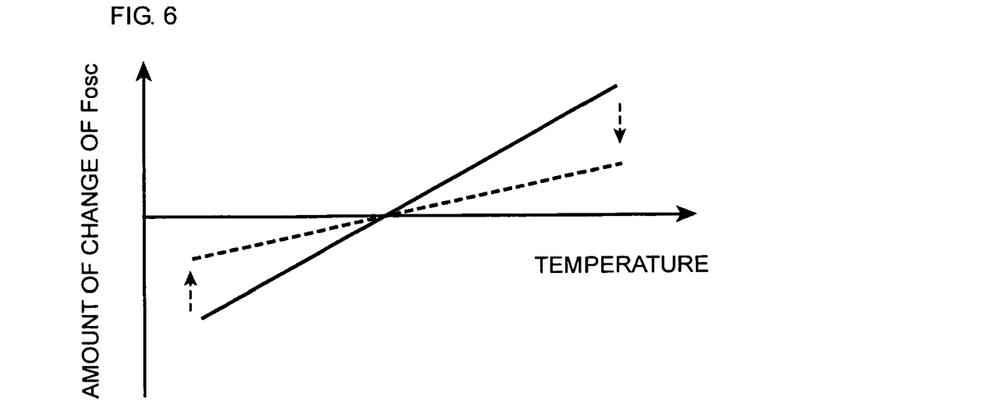
FIG. 6 is a schematic view showing changes in a resonance frequency due to temperature when a response for suppression resulting from the width dimension is not coupled, also showing the fact that first and second responses for suppression are coupled with a main response and temperature characteristics are improved in the thickness extensional piezoelectric resonator according to an embodiment of the present invention.

FIG. 6 shows changes in resonance characteristics when temperature increases higher than or decreases lower than room temperature (25° C.) by using the resonance frequency Fr at room temperature (25° C.) as a reference. The solid line shows results in the case of a thickness extensional piezoelectric resonator as a reference example in which first and second responses for suppression are not configured to be coupled with the main response. The broken line shows results when the first and second responses for suppression are coupled with the main response in accordance with the above-described embodiment.

As indicated by the broken line of FIG. 6, according to this embodiment, changes in the resonance frequency and the anti-resonance frequency due to changes with temperature can be effectively reduced over a wide temperature range from a temperature range lower than room temperature to a high temperature range, for example, approximately 0° C. to 70° C. For example, the changes can be made within ±100 ppm.

Figure 7:
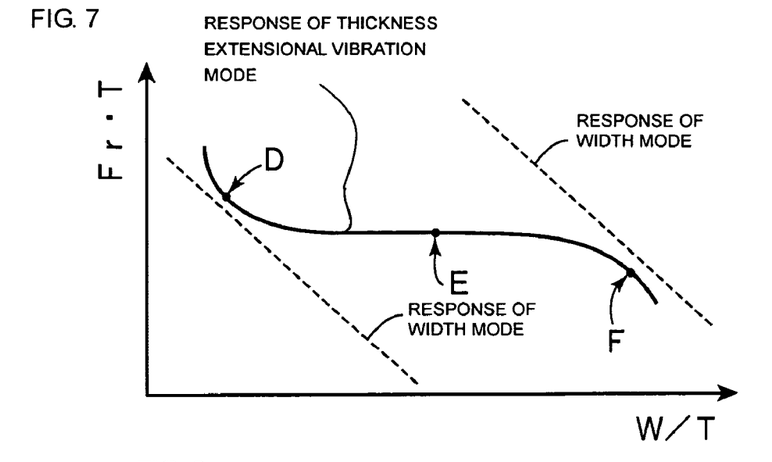
FIG. 7 shows changes in Fr·T of a response of a third-order harmonic of thickness extensional vibration, which is a main response, and changes in Fr·T of a response for suppression resulting from the width dimension due to the ratio W/T.
Figure 8:
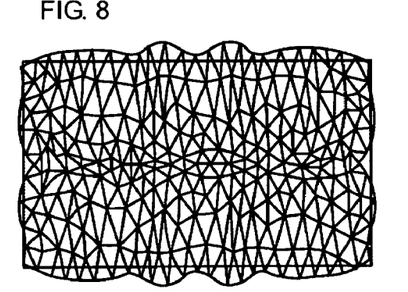
FIG. 8 is a schematic view showing results in which a vibration displacement state of a piezoelectric body in the transverse direction at a position indicated by an arrow D of FIG. 7 is analyzed by FEM.
Figure 9:
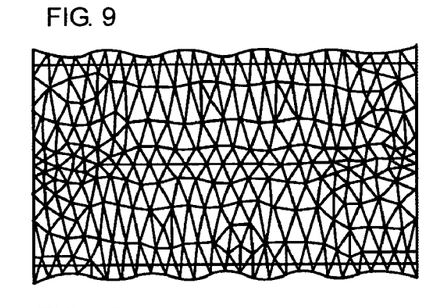
FIG. 9 is a schematic view showing results in which a vibration displacement state of a piezoelectric body in the transverse direction at a position indicated by an arrow E of FIG. 7 is analyzed by FEM.
Figure 10:
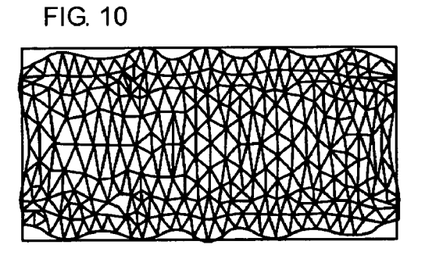
FIG. 10 is a schematic view showing results in which a vibration displacement state of a piezoelectric body in the transverse direction at a position indicated by an arrow F of FIG. 7 is analyzed by FEM.

In order to allow the frequencies of the first and second responses for suppression to be positioned as described above, frequency characteristics of the width mode, which cause the first and second responses for suppression to occur, should each preferably be controlled. FIG. 7 shows the relationship between a frequency constant (Fr·T) of a response based on the width mode at room temperature, and the ratio W/T of the width W of the piezoelectric substrate 2 to the thickness T. FIG. 8 to FIG. 10 are each a schematic view showing a vibration state obtained by analysis using a finite element method of a cross section passing through the center of the piezoelectric substrate 2 at positions D to F of FIG. 7.

As is clear from FIG. 7, and FIGS. 8 to 10, it can be seen that as a result of selecting the ratio W/T, the response of a third-order harmonic of a thickness extensional vibration mode, which is the main response, and the response of vibration in the width direction are coupled together. When they are not coupled, for the main response, dominant vibration displacement is shown in the thickness direction, whereas, as the degree of coupling increases, displacement in the width direction becomes large.

The third-order harmonic of the thickness extensional vibration shows a positive frequency-temperature-change tendency, and the responses based on the width mode, which are used as the first and second responses for suppression, have negative frequency-temperature characteristics as described above. Therefore, by coupling the first and second responses for suppression with the main response so as to be capable of canceling the temperature characteristics of the main response, temperature characteristics can be improved as a whole.

As is clear from the results of FIG. 7 and FIGS. 8 to 10, the positions of the first and second responses for suppression resulting from the width dimension should preferably be selected so that the ratio W/T is selected so as to cause the above-described coupling to occur.

Therefore, the temperature characteristics can be improved in accordance with the above-described embodiment by selecting the ratio W/T so that the first and second responses for suppression based on the vibration mode in the width direction are coupled with the main response, which is a response of a third-order harmonic of thickness extensional vibration.

Next, frequency-temperature characteristics of the thickness extensional piezoelectric resonator of the above-described embodiment and the comparative example will be specifically compared with each other.

Figure 11:
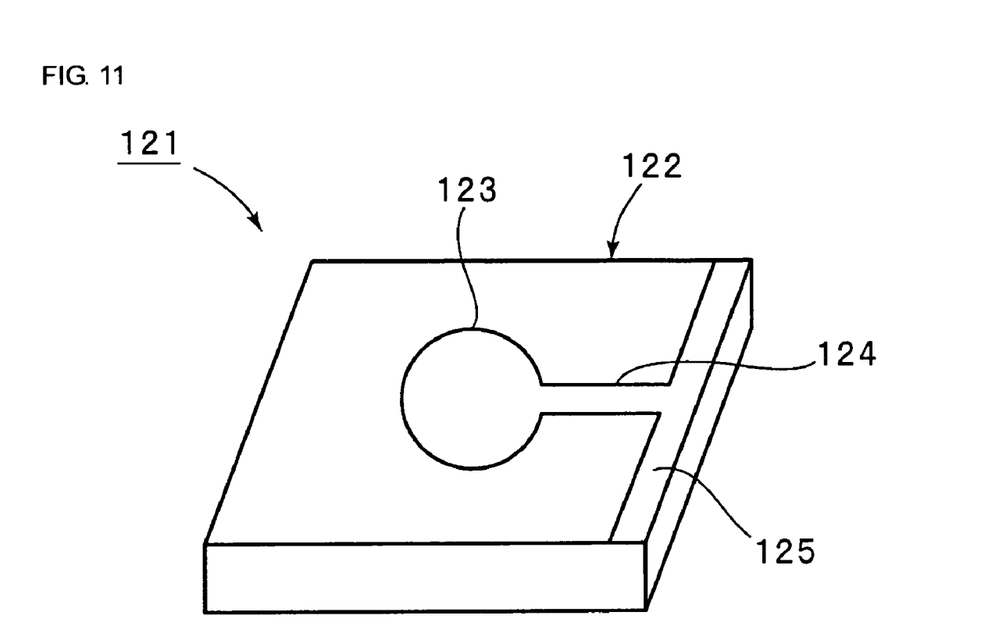
FIG. 11 is a perspective view showing the exterior of a thickness extensional piezoelectric resonator of a comparative example, which is provided for comparison.

FIG. 11 is a perspective view of a thickness extensional piezoelectric resonator of the related art provided for comparison. A piezoelectric resonator 121 has a piezoelectric substrate 122 in the shape of a rectangular plate having a length of 2.2 mm, a width of 1.6 mm, and a thickness of 0.24 mm. The electro-mechanical coupling coefficient $k_{33}$ in the thickness direction in the piezoelectric substrate 122 is 43.9%, and the electro-mechanical coupling coefficient $k_{31}$ in the width direction is 7.7%. On the top surface of the piezoelectric substrate 122, a first resonance electrode 123 in the shape of a circle having a diameter of 0.80 mm is formed. Although not particularly shown in the figure, a second resonance electrode having the same shape is formed on the bottom surface of the piezoelectric substrate 122 in such a manner as to oppose the resonance electrode 123. The resonance electrode 123 is electrically connected to a terminal electrode 125 with a connection electrode 124 therebetween.

The width of the connection electrode 124, that is, the dimension along the width direction of the piezoelectric substrate 122, is set to 0.25 mm. The distance between the end portion on the resonance electrode 123 side of the terminal electrode 125 and the edge formed by the top surface and the end surface of the piezoelectric substrate 122 of the terminal electrode 125 is set to 0.30 mm.

The second resonance electrode on the bottom surface is similarly electrically connected to the terminal electrode with a connection electrode therebetween. The piezoelectric substrate 122 is formed of a $PbTiO_3$ substrate that is polarized in the thickness direction, and the various kinds of electrodes are formed of thin films of silver having a thickness of 0.3 µm, which are formed by sputtering. By controlling the thickness of the piezoelectric substrate 122, the energy-trapping-type thickness extensional piezoelectric resonator 121 using a third-order harmonic of thickness extensional vibration as a main response is manufactured.

Figure 12:
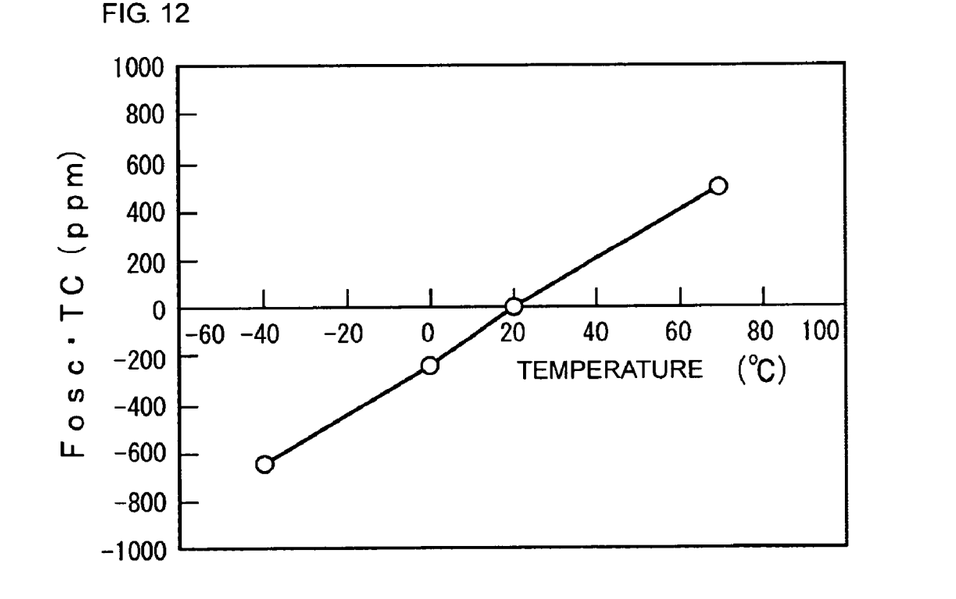
FIG. 12 shows changes, due to temperature, in the resonance frequency of the thickness extensional piezoelectric resonator of the comparative example shown in FIG. 11.
Figure 13:
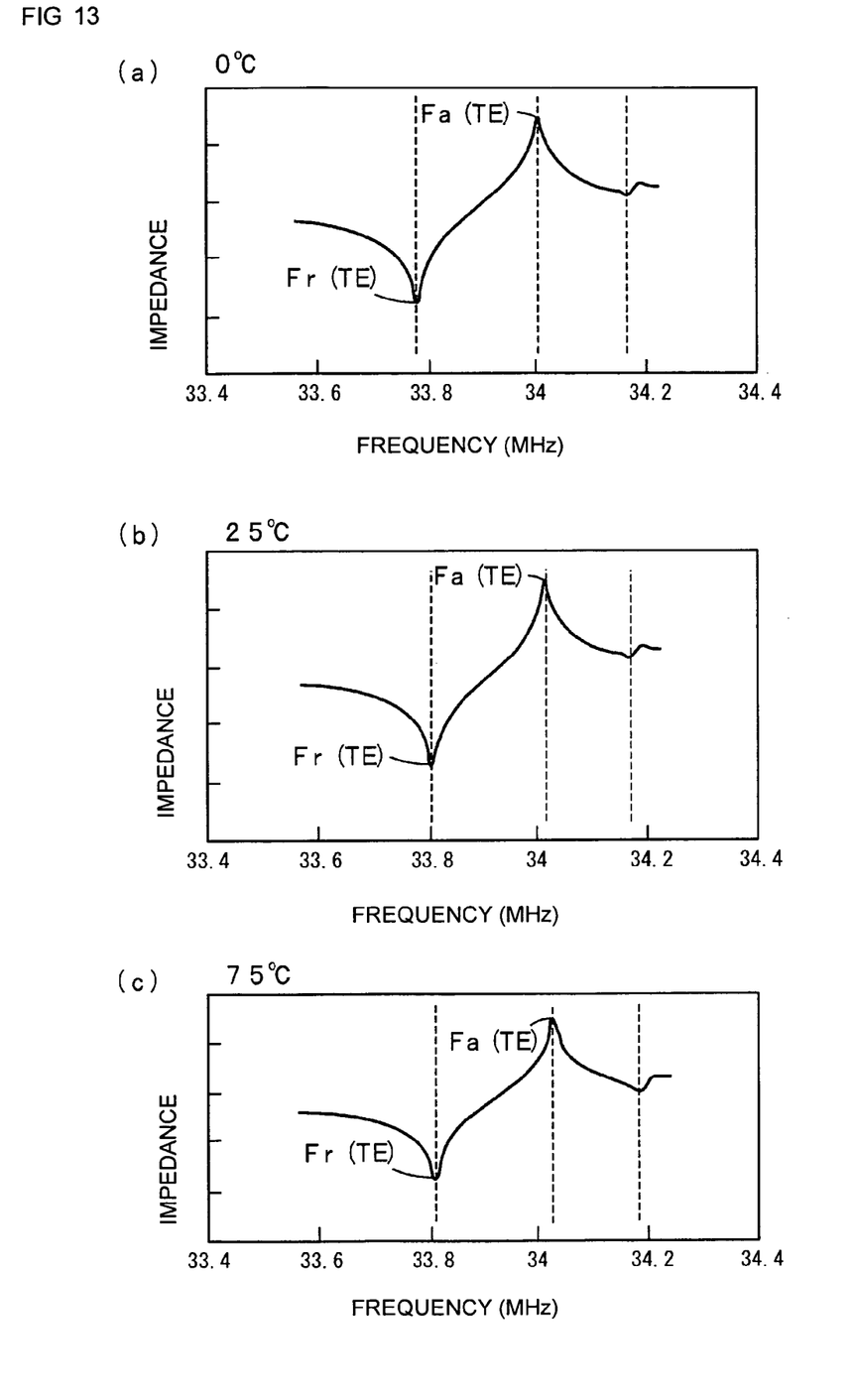
FIG. 13 shows impedance characteristics at 0° C., 25° C., and 70° C., of the thickness extensional piezoelectric resonator of the comparative example shown in FIG. 11.

Oscillation frequency-temperature characteristics of an oscillation circuit using the thickness extensional piezoelectric resonator 121 of a comparative example, which is obtained in the manner described above, are shown in FIG. 12. As is clear from FIG. 12, it can be seen that, as temperature increases from −40° C. to 70° C., the rate of change Fosc·TC (ppm) of the oscillation frequency Fosc increases. That is, as resonance characteristics at 0° C., 25° C., and 75° C. are shown in FIGS. 13(a), 13(b), and 13(c), respectively, it can be seen that the resonance frequency and the anti-resonance frequency shift toward higher frequencies as temperature increases.

Figure 14:
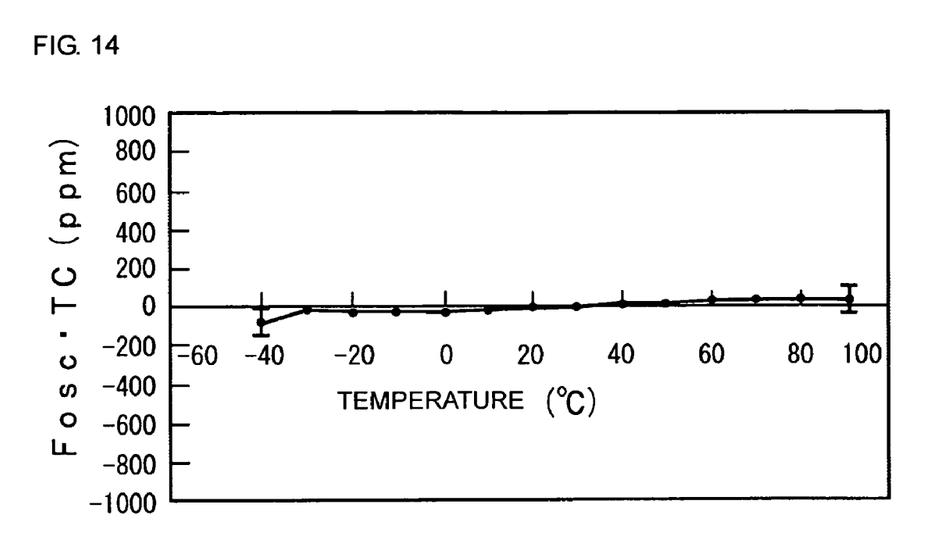
FIG. 14 shows frequency-temperature characteristics of the thickness extensional piezoelectric resonator of the embodiment shown in FIG. 1.

On the other hand, FIG. 14 shows oscillation frequency-temperature characteristics using the thickness extensional piezoelectric resonator 1 of the above-described embodiment. Here, results of 15 thickness extensional piezoelectric resonators 1 are shown. That is, the upper limit, the lower limit, and the average value of the rate of change Fosc·TC of the resonance frequencies Fosc of the 15 thickness extensional piezoelectric resonators at each temperature are shown.

FIGS. 15(a) to 15(c) are enlarged views of the vicinity of the anti-resonance frequency of resonance characteristics at 0° C., 25° C., and 70° C. of the thickness extensional piezoelectric resonator 1, respectively. FIGS. 16(a) to 16(c) show changes in the resonance frequency of the resonance characteristics of the thickness extensional piezoelectric resonator 1 at 0° C., 25° C., and 70° C., respectively.

Figure 15:
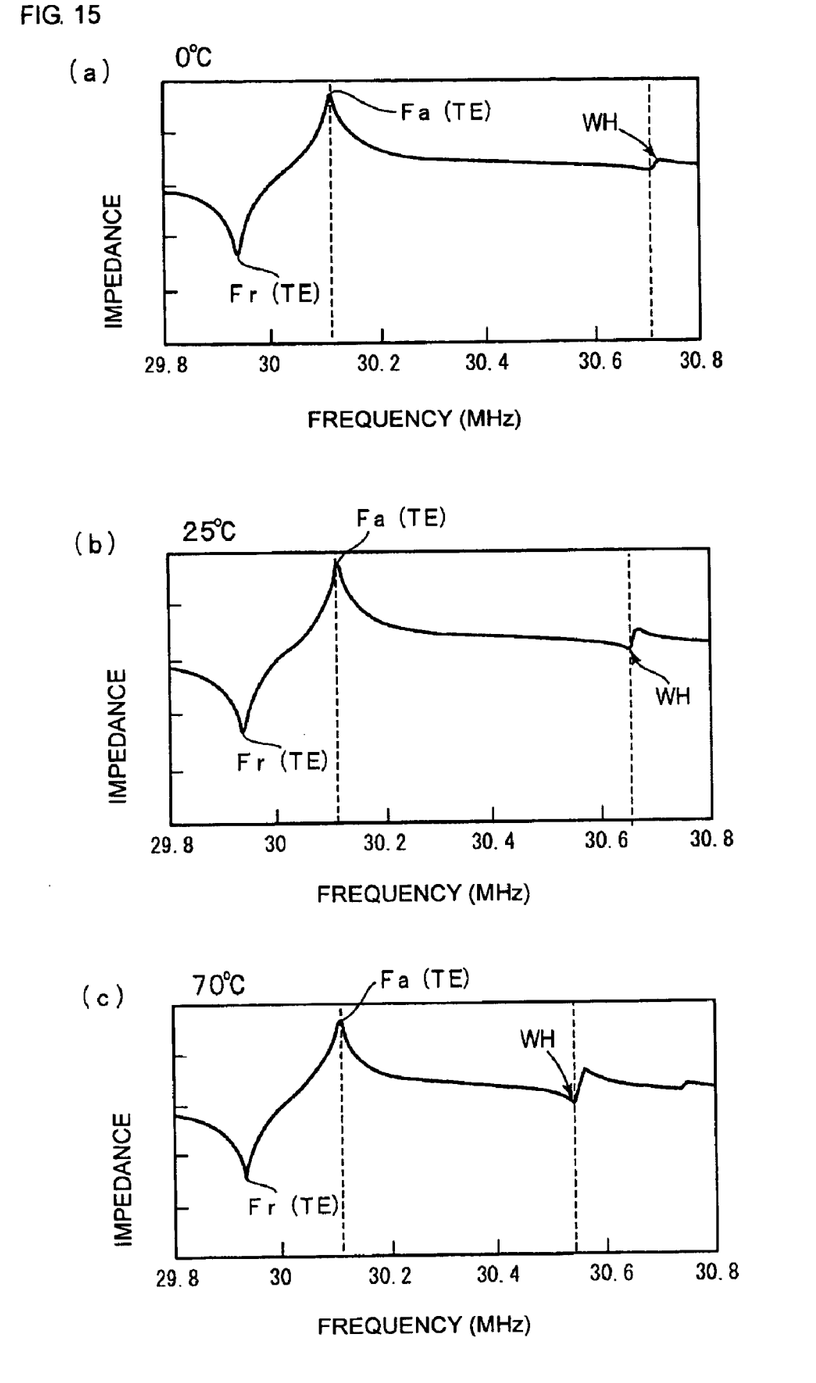
FIGS. 15(a) to 15(c) show frequency characteristics of the thickness extensional piezoelectric resonator on the anti-resonance frequency side at 0° C., 25° C., and 70° C., of the embodiment shown in FIG. 1.
Figure 16:
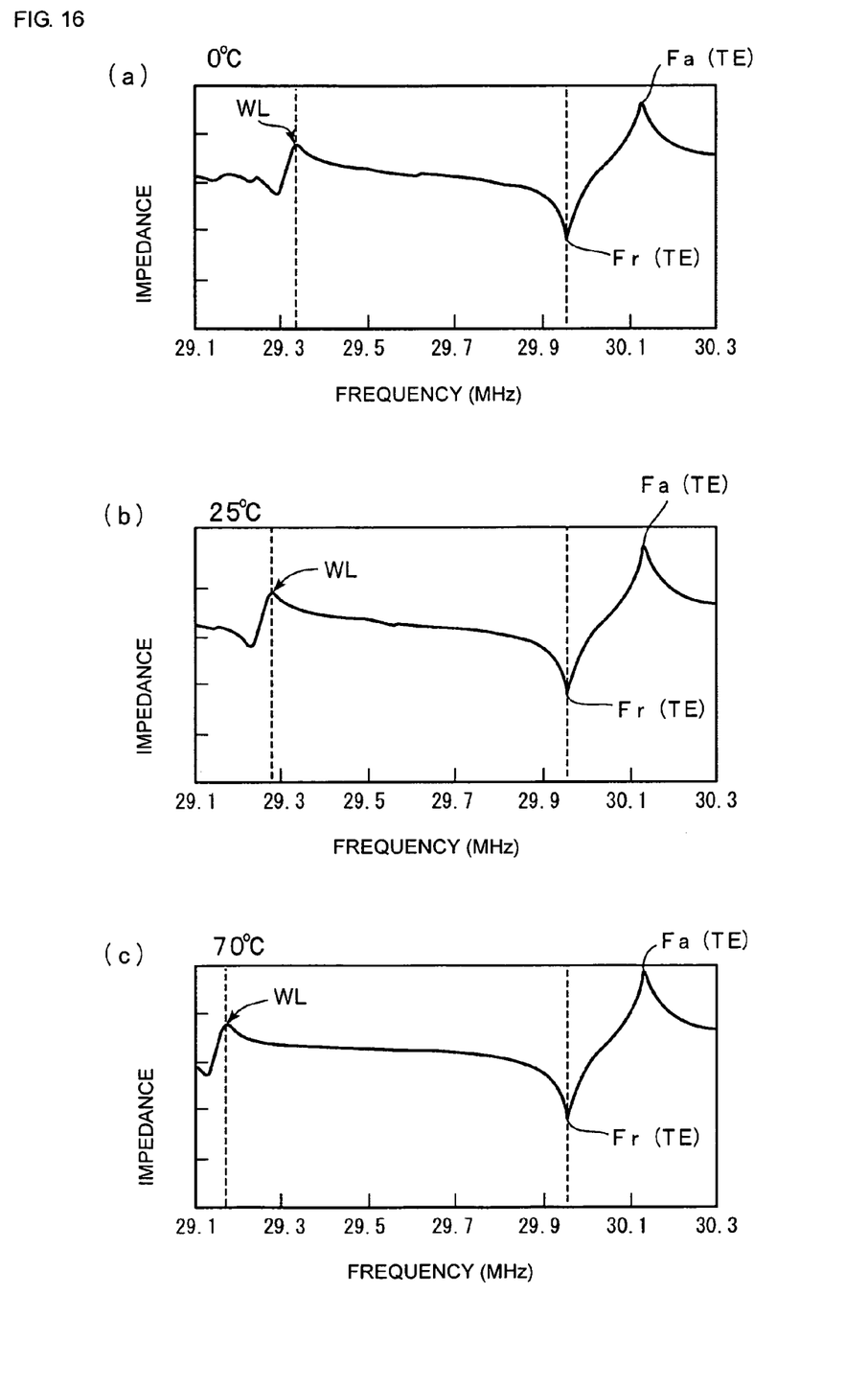
FIGS. 16(a) to 16(c) show frequency characteristics of the thickness extensional piezoelectric resonator at the resonance frequency at 0° C., 25° C., and 70° C., of the embodiment shown in FIG. 1.

As is clear from FIG. 14 to FIG. 16, it can be seen that, as temperature increases, a first response WH for suppression positioned higher than the anti-resonance frequency Fa(TE) approaches the anti-resonance frequency Fa(TE), and as a result, the shift of the anti-resonance frequency Fa(TE) toward higher frequencies is suppressed. Similarly, it can be seen that, at lower frequencies, as temperature decreases from 70° C. to 0° C., a second response (WL) for suppression positioned lower than the resonance frequency Fr(TE) shifts toward higher frequencies, and as a result, the shift of the resonance frequency Fr(TE) of the main response due to temperature decrease is suppressed.

The above-described difference between the response for suppression and the main response in the thickness extensional piezoelectric resonator 1 can be controlled by varying the ratio W/T of the dimension in the width direction to the thickness in the thickness extensional piezoelectric resonator 1. That is, since the first and second responses for suppression are responses resulting from the width dimension, the frequency difference can easily be set by varying W/T. That is, the first and second responses for suppression can be coupled with the main response, making it possible to suppress the shift of the resonance frequency and the anti-resonance frequency of the main response.

In other words, by setting the above mentioned frequency difference in order to suppress the frequency changes of characteristics of the main response due to temperature, and setting W/T in accordance with the frequency difference, changes in the frequency characteristics due to changes with temperature can be suppressed in accordance with the above-described embodiment.

Figure 17:
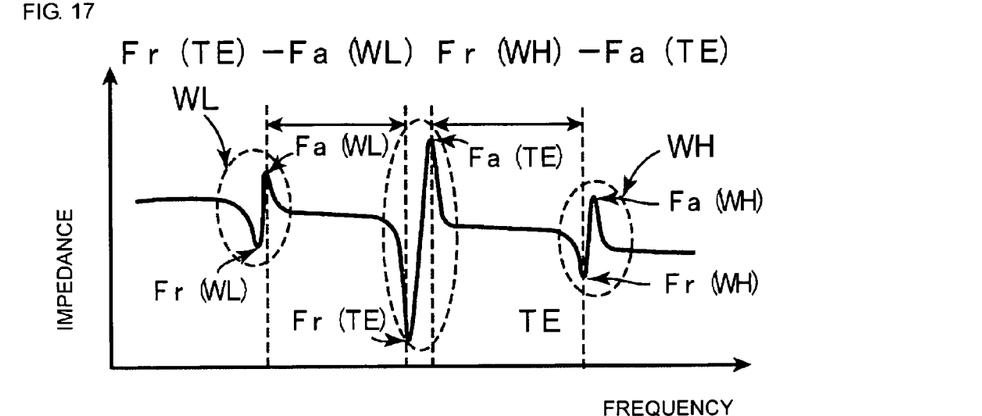
FIG. 17 is a schematic view illustrating frequency differences between a main response in the thickness extensional piezoelectric resonator of the embodiment and first and second responses for suppression.

This will be described more specifically with reference to FIG. 17 to FIG. 19. FIG. 17 is a schematic view showing the relationship between the frequency of the main response and frequencies of the first and second responses for suppression. The resonance frequency of the main response is denoted as Fr(TE) and the anti-resonance frequency is denoted as Fa(TE). The resonance frequency of the first response WH for suppression is denoted as Fr(WH), and the anti-resonance frequency of the second response WL for suppression is denoted as Fa(WL). In this case, at higher frequencies of the main response, the frequency difference Fr(WH)−Fa(TE) should preferably be selected so that the above-described effect is obtained. At lower frequencies, the frequency difference Fr(TE)−Fa (WL) should preferably be selected so that the above-described suppression effect is obtained.

Figure 18:
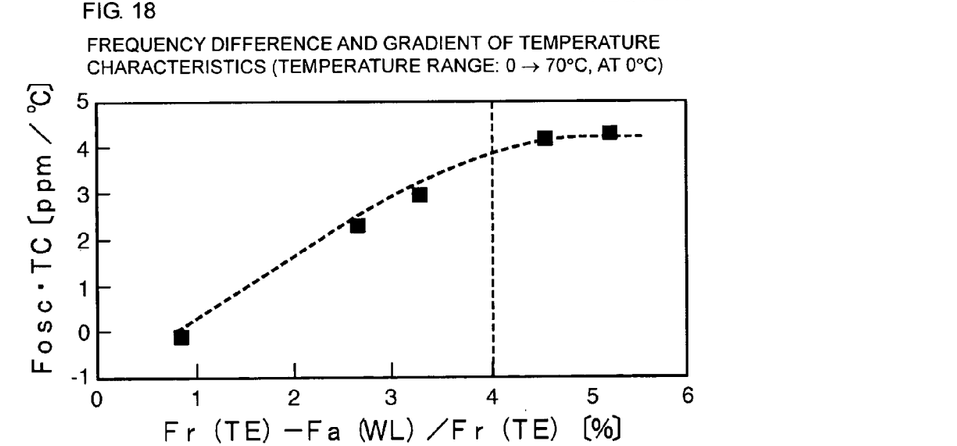
FIG. 18 shows the relationship between (Fr(TE)−Fa(WL))/Fr(TE) when temperature is changed from 0° C. to 70° C. and the rate of change Fa·TC of the resonance frequency due to temperature in an embodiment of the present invention.
Figure 19:
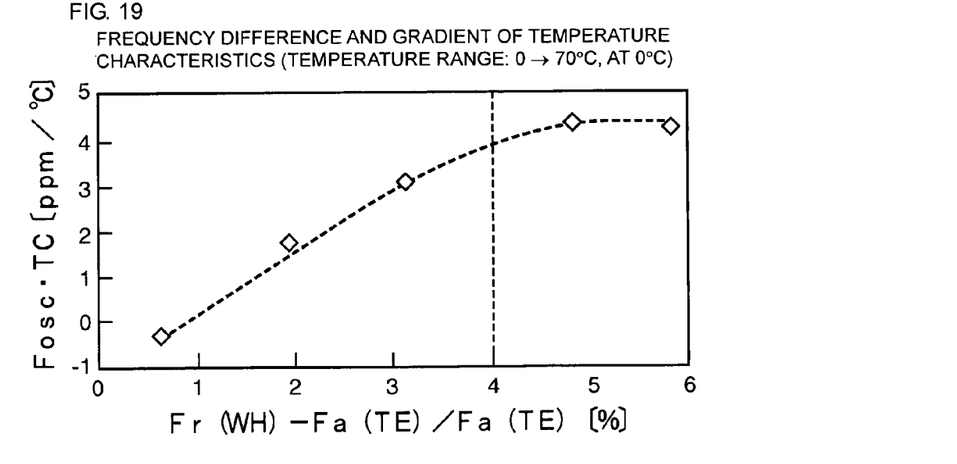
FIG. 19 shows the relationship between (Fr(WH)−Fa(TE))/Fr(TE) when temperature is changed from 0° C. to 70° C. and Fa-TC, the rate of change of the resonance frequency due to temperature in an embodiment of the present invention.

FIG. 18 and FIG. 19 show changes in Fosc·TC (ppm), the rate of change of the oscillation frequency Fosc, due to temperature, of the oscillation circuit using the thickness extensional piezoelectric resonator 1 when the frequency difference is varied. The horizontal axes of FIG. 18 and FIG. 19 show (Fr(TE)−Fa (WL))/Fr(TE) at 0° C. and (Fr(WH)−Fa(TE))/Fa(TE) at 70° C., respectively. It can be seen from FIG. 18 that, at lower frequencies, when temperature is varied from 0° C. to 70° C., if (Fr(TE)−Fa(WL))/Fr(TE) (hereinafter referred to as expression (1)) at 0° C. is smaller than or equal to 0.04, the rate of change Fosc·TC of frequency-temperature characteristics of the oscillation frequency can be made smaller than or equal to 4 ppm/° C.

Similarly, at higher frequencies, when temperature is varied from 0° C. to 70° C., if (Fr(WH)−Fa(TE))/Fa(TE) (hereinafter referred to as expression (2)) at 70° C. is smaller than or equal to 0.04, the rate of change Fosc·TC of frequency-temperature characteristics of the oscillation frequency can be made to be smaller than or equal to 4 ppm/° C. Therefore, the ratio W/T should preferably be determined so that expressions (1) and (2) described above are satisfied. As a result, changes in frequency characteristics of the thickness extensional piezoelectric resonator 1 due to temperature can be further reduced.

Figure 20:
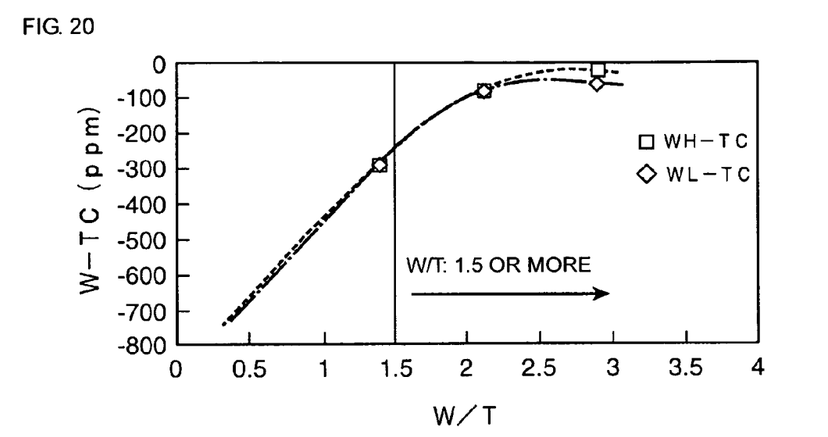
FIG. 20 shows the relationship between the ratio W/T in the thickness extensional piezoelectric resonator of the embodiment and the rate of change of temperature characteristics of a response based on the width mode.

The gradient of temperature characteristics of the response resulting from the width dimension is varied in accordance with the ratio W/T. That is, as shown in FIG. 20, it can be seen that, when the ratio W/T is varied, the rate of change of temperature characteristics of the response resulting from the width dimension is varied. More specifically, it can be seen that as W/T decreases, the changes in the response resulting from the width dimension due to temperature increases in a negative direction. It can also be seen that there is hardly difference between the gradients of temperature characteristics of the second response WL for suppression at lower frequencies and of the first response WH for suppression at higher frequencies.

In the piezoelectric resonator 1, it is preferable that the ratio W/T be substantially greater than or equal to 1.5 in order to ensure the capacity as a resonator. Therefore, it is preferable that the response resulting from the width dimension, serving as a response for suppression, which is used when temperature characteristics are controlled in the thickness extensional piezoelectric resonator 1 of the embodiment, have a gradient of temperature characteristics greater than or equal to −300 ppm/° C. and less than 0 ppm/° C.

Figure 21:
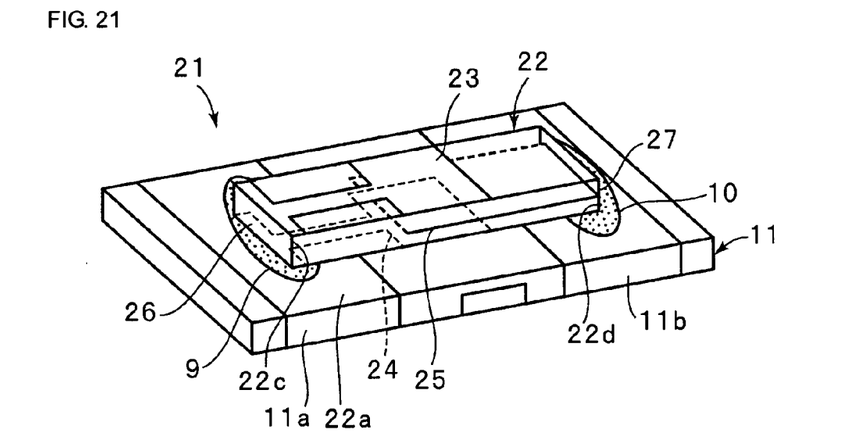
FIG. 21 is a perspective view illustrating another example of the thickness extensional piezoelectric resonator to which the present invention is applied.

In the above-described embodiment, the thickness extensional piezoelectric resonator 1 using a third-order harmonic of thickness extensional vibration has been described. However, the present invention is not limited to a thickness extensional piezoelectric resonator using a third-order harmonic of thickness extensional vibration. FIG. 21 is a perspective view illustrating another example of the thickness extensional piezoelectric resonator to which the present invention is applied.

In a thickness extensional piezoelectric resonator 21, on the top surface of a piezoelectric substrate 22 in the shape of a rectangular plate, a first resonance electrode 23 is formed, and on the bottom surface, a second resonance electrode 24 is formed. The thickness extensional piezoelectric resonator 21 has an internal electrode 25 opposing the resonance electrodes 23 and 24 within the piezoelectric substrate 22. The first and second resonance electrodes 23 and 24 are each electrically connected to a terminal electrode 26 provided on one of the end surfaces 22c of the piezoelectric substrate 22. On the other hand, the internal electrode 25 is electrically connected to a terminal electrode 27 provided on an end surface 22d. The piezoelectric substrate 22 is formed of a suitable piezoelectric ceramic, such as $PbTiO_3$-based ceramic and is subjected to a polarization process in the thickness direction thereof. The various electrodes can be formed using suitable conductive materials in the same manner as for the thickness extensional piezoelectric resonator 1.

The thickness extensional piezoelectric resonator 21 is mounted on the mounting substrate 11 similarly to the thickness extensional piezoelectric resonator 1.

In the thickness extensional piezoelectric resonator 21, a second-order harmonic of thickness extensional vibration can be used as a main response by applying an AC electric field between the first and second resonance electrodes 23 and 24 and the internal electrode 25. Also, in such a thickness extensional piezoelectric resonator 21 using a second-order harmonic of thickness extensional vibration, by setting the ratio W/T so that the first and second responses for suppression are coupled with the main response and frequency variations of the main response due to temperature can be suppressed, changes in frequency characteristics due to changes with temperature can be reduced in the same manner as in the first embodiment.

That is, the present invention can also be applied to a thickness extensional piezoelectric resonator using not only a third-order harmonic of thickness extensional vibration but also another harmonic such as a second-order harmonic. Furthermore, as long as thickness extensional vibration is used, the present invention can be applied to a thickness extensional piezoelectric resonator using a harmonic other than a second-order harmonic and a third-order harmonic. In the above-described embodiment, when the first response for suppression is brought into close proximity with the main response at higher frequencies of the main response and the second response for suppression is brought into close proximity with the main response at lower frequencies of the main response, only one of the first response for suppression and the second response for suppression may be coupled with the main response. In that case, the coupled response for suppression enables the suppression of frequency changes of the main response due to temperature toward the response for suppression.

In the above-described embodiment, as the response for suppression for suppressing changes of the main response, a response based on the width mode is used. Alternatively, a response based on a vibration mode other than the width mode may be used as a response for suppression. In that case, the dimensions other than W/T or the like may be adjusted according to the vibration form of the response for suppression to be used.

In addition, in the above-described embodiment, the response for suppression having a temperature change tendency that cancels changes with temperature of the resonance frequency and/or the anti-resonance frequency is used. The polarity of the frequency-temperature-change tendency of the response for suppression may be the same as that of the frequency-temperature-change tendency of the main response. In that case, frequency changes of the response for suppression due to temperature should preferably be smaller than frequency changes of the main response due to temperature. Also, in that case, frequency changes of the main response due to changes with temperature can be suppressed.

The invention claimed is:

1. An energy-trapping-type thickness extensional piezoelectric resonator using a thickness extensional vibration mode, comprising:
    a piezoelectric substrate having a top surface and a bottom surface, the piezoelectric substrate being polarized in a thickness direction connecting the top surface and the bottom surface;
    first and second resonance electrodes located in a central area of the top surface and the bottom surface of the piezoelectric substrate, respectively, the first and second resonant electrodes positioned so as to oppose each other with the piezoelectric substrate therebetween;
    a first terminal electrode provided on a first end surface of the piezoelectric substrate; and
    a first connection electrode on the top surface of the piezoelectric substrate, the first connecting electrode electrically connecting the first resonance electrode to first terminal electrode,
    wherein the first connecting electrode does not span the entire width of the piezoelectric substrate,
    wherein the extensional piezoelectric resonator couples a suppression response having a frequency-temperature-change tendency with a main response of the thickness extensional vibration mode so as to suppress changes in frequency of the main response due to temperature,
    wherein the piezoelectric substrate has a strip-shape extending in a length direction, the first and second resonance electrodes span an entire width of the piezoelectric substrate in the central area and do not extend to either edge of the substrate in the length direction of the top surface and the bottom surface of the piezoelectric substrate, respectively, and the suppression response is a response resulting from the width of the piezoelectric substrate, and
    wherein at least one resonance frequency of the suppression response resulting from the width is higher than an anti-resonance frequency of the main response.

2. The thickness extensional piezoelectric resonator according to claim 1, wherein the suppression response has a frequency-temperature-change tendency in a direction opposite to that of a frequency-temperature-change tendency of the main response.

3. The thickness extensional piezoelectric resonator according to claim 1, wherein the frequency-temperature-change tendency of the suppression response is in the same direction as that of a frequency-temperature-change tendency of the main response, and changes in frequency of the suppression response are smaller than the changes in frequency of the main response due to temperature.

4. The thickness extensional piezoelectric resonator according to claim 1, wherein, when the anti-resonance frequency of the main response is denoted as Fa(TE) and the resonance frequency of the suppression response resulting from the width is denoted as Fr(WH), (Fr(WH)−Fa(TE))/Fa(TE) is greater than 0 and smaller than or equal to 0.04 at least in an upper limit of a used temperature range.

5. An energy-trapping-type thickness extensional piezoelectric resonator using a thickness extensional vibration mode, comprising:
    a piezoelectric substrate having a top surface and a bottom surface, the piezoelectric substrate being polarized in a thickness direction connecting the top surface and the bottom surface;
    first and second resonance electrodes located in a central area of the top surface and the bottom surface of the piezoelectric substrate, respectively, the first and second resonant electrodes positioned so as to oppose each other with the piezoelectric substrate therebetween;
    a first terminal electrode provided on a first end surface of the piezoelectric substrate; and
    a first connection electrode on the top surface of the piezoelectric substrate, the first connecting electrode electrically connecting the first resonance electrode to first terminal electrode,
    wherein the first connecting electrode does not span the entire width of the piezoelectric substrate,
    wherein the extensional piezoelectric resonator couples a suppression response having a frequency-temperature-change tendency with a main response of the thickness extensional vibration mode so as to suppress changes in frequency of the main response due to temperature,
    wherein the piezoelectric substrate has a strip-shape extending in a length direction, the first and second resonance electrodes span an entire width of the piezoelectric substrate in the central area and do not extend to either edge of the substrate in the length direction of the top surface and the bottom surface of the piezoelectric substrate, respectively, and the suppression response is a response resulting from the width of the piezoelectric substrate, and wherein at least one suppression response resulting from the width is lower than a resonance frequency of the main response.

6. The thickness extensional piezoelectric resonator according to claim 5, wherein, when the resonance frequency of the main response is denoted as Fr(TE) and an anti-resonance frequency of the suppression response resulting from the width is denoted as Fa(WL), (Fr(TE)−Fa(WL))/Fr(TE) is greater than 0 and smaller than or equal to 0.04 at least in a lower limit of a used temperature range.

7. An energy-trapping-type thickness extensional piezoelectric resonator using a thickness extensional vibration mode, comprising:
 a piezoelectric substrate having a top surface and a bottom surface, the piezoelectric substrate being polarized in a thickness direction connecting the top surface and the bottom surface;
 first and second resonance electrodes located in a central area of the top surface and the bottom surface of the piezoelectric substrate, respectively, the first and second resonant electrodes positioned so as to oppose each other with the piezoelectric substrate therebetween;
 a first terminal electrode provided on a first end surface of the piezoelectric substrate; and
 a first connection electrode on the top surface of the piezoelectric substrate, the first connecting electrode electrically connecting the first resonance electrode to first terminal electrode,
 wherein the first connecting electrode does not span the entire width of the piezoelectric substrate,
 wherein the extensional piezoelectric resonator couples a suppression response having a frequency-temperature-change tendency with a main response of the thickness extensional vibration mode so as to suppress changes in frequency of the main response due to temperature,
 wherein the piezoelectric substrate has a strip-shape extending in a length direction, the first and second resonance electrodes span an entire width of the piezoelectric substrate in the central area and do not extend to either edge of the substrate in the length direction of the top surface and the bottom surface of the piezoelectric substrate, respectively, and the suppression response is a response resulting from the width of the piezoelectric substrate, and
 wherein the suppression response resulting from the width comprises a first response at a frequency higher than an anti-resonance frequency of the main response and a second response at a frequency lower than a resonance frequency of the main response.

8. The thickness extensional piezoelectric resonator according to claim 7, wherein, when the resonance frequency of the main response is denoted as Fr(TE), the anti-resonance frequency of the main response is denoted as Fa(TE), a resonance frequency of the first response is denoted as Fr(WH), and an anti-resonance frequency of the second response is denoted as Fa(WL),
 (Fr(WH)−Fa(TE))/Fa(TE) is greater than 0 and smaller than or equal to 0.04 at least in an upper limit of a used temperature range, and (Fr(TE)−Fa(WL))/Fr(TE) is greater than 0 and smaller than or equal to 0.04 at least in a lower limit of the used temperature range.

9. The thickness extensional piezoelectric resonator according to claim 1, wherein the main response is a harmonic response of thickness extensional vibration.

10. The thickness extensional piezoelectric resonator according to claim 9, wherein the thickness extensional piezoelectric resonator uses a third-order harmonic of the thickness extensional vibration mode.

11. The thickness extensional piezoelectric resonator according to claim 1, further comprising an internal electrode provided within the piezoelectric substrate and positioned so as to oppose the first and second resonance electrodes with a piezoelectric substrate layer therebetween.

12. The thickness extensional piezoelectric resonator according to claim 1, further comprising:
 a second terminal electrode provided on a second end surface of the piezoelectric substrate opposite the first end; and
 a second connection electrode on the bottom surface of the piezoelectric substrate, the second connecting electrode electrically connecting the second resonance electrode to second terminal electrode.

13. The thickness extensional piezoelectric resonator according to claim 5, further comprising:
 a second terminal electrode provided on a second end surface of the piezoelectric substrate opposite the first end; and
 a second connection electrode on the bottom surface of the piezoelectric substrate, the second connecting electrode electrically connecting the second resonance electrode to second terminal electrode.

14. The thickness extensional piezoelectric resonator according to claim 7, further comprising:
 a second terminal electrode provided on a second end surface of the piezoelectric substrate opposite the first end; and
 a second connection electrode on the bottom surface of the piezoelectric substrate, the second connecting electrode electrically connecting the second resonance electrode to second terminal electrode.

15. The thickness extensional piezoelectric resonator according to claim 1, further comprising:
 a second connection electrode on the bottom surface of the piezoelectric substrate, the second connecting electrode electrically connecting the second resonance electrode to first terminal electrode.

16. The thickness extensional piezoelectric resonator according to claim 5, further comprising:
 a second connection electrode on the bottom surface of the piezoelectric substrate, the second connecting electrode electrically connecting the second resonance electrode to first terminal electrode.

17. The thickness extensional piezoelectric resonator according to claim 7, further comprising:
 a second connection electrode on the bottom surface of the piezoelectric substrate, the second connecting electrode electrically connecting the second resonance electrode to first terminal electrode.

* * * * *